United States Patent [19]
Kato

[11] Patent Number: 5,383,144
[45] Date of Patent: Jan. 17, 1995

[54] SUBSAMPLING METHOD AND INTERPOLATION METHOD OF DIGITAL SIGNALS

[75] Inventor: Shiro Kato, Hirakata, Japan

[73] Assignee: Matsushita Electric Industrial Co., Ltd., Osaka, Japan

[21] Appl. No.: 794,219

[22] Filed: Nov. 19, 1991

[30] Foreign Application Priority Data

Nov. 20, 1990 [JP] Japan .................... 2-317224

[51] Int. Cl.$^6$ ............................................. G06F 15/31
[52] U.S. Cl. ................................................. 364/724.1
[58] Field of Search ............... 364/723, 724.01, 724.1, 364/724.16; 370/123

[56] References Cited

U.S. PATENT DOCUMENTS

| | | | |
|---|---|---|---|
| 4,852,035 | 7/1989 | Michener | 364/724.1 |
| 4,896,320 | 1/1990 | Göckler | 364/724.1 X |
| 4,953,117 | 8/1990 | Lagadec | 364/724.1 |
| 5,119,193 | 6/1992 | Noji | 364/724.1 X |
| 5,177,700 | 1/1993 | Göckler | 364/724.1 |

OTHER PUBLICATIONS

"A Digital Signal Processing Approach to Interpolation", Schafer et al., Proceedings of the IEEE, vol. 61, No. 6, Jun. 1973, pp. 692–702.

"Digital Video Signal Processing in Home VTRS", Kato et al., IEEE Transactions On Consumer Electronics, Vo. CE-32, No. 3, Aug. 1986, pp. 372–378.

Primary Examiner—Roy N. Envall, Jr.
Assistant Examiner—Chuong D. Ngo
Attorney, Agent, or Firm—Wenderoth, Lind & Ponack

[57] ABSTRACT

A subsampling method has a step of judging whether or not an input signal is an interpolated signal, and a subsampling step of performing only the removal of a sample when the input signal is the interpolated signal and the pre-processing and the removal of the sample when it is not. An interpolation method has at least one interpolation method in which the sample data of an input signal is directly stored. The interpolation method for an input signal can be switched in response to additional information. A detection method of additional information effects interpolation using the sample of an input signal at a predetermined position only, and compares it with the input signal, thereby detecting additional information multiplexed with the input signal.

8 Claims, 5 Drawing Sheets

FIG. 5(a) SPECTRUM OF SIGNAL S
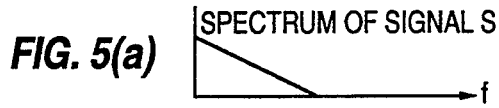

FIG. 5(b) SPECTRUM OF SIGNAL A
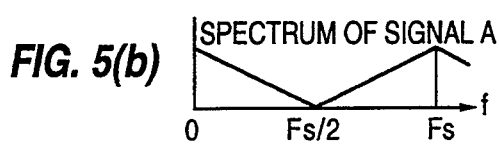

FIG. 5(c) FREQUENCY RESPONSE OF FILTER FOR SUBSAMPLING
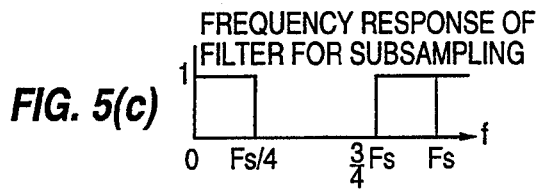

FIG. 5(d) SPECTRUM OF FILTER OUTPUT
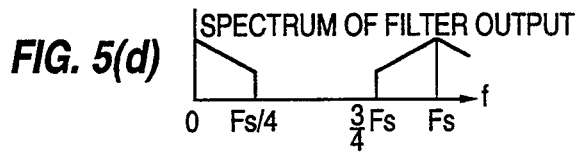

FIG. 5(e) SPECTRUM OF SIGNAL B
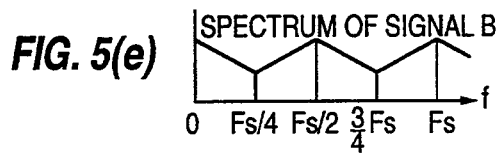

FIG. 5(f) FREQUENCY RESPONSE OF FILTER FOR INTERPOLATION
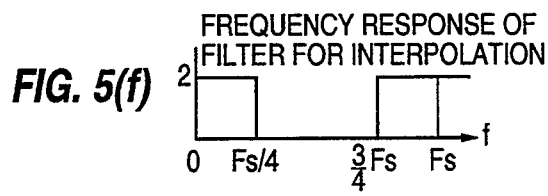

FIG. 5(g) SPECTRUM OF SIGNAL C
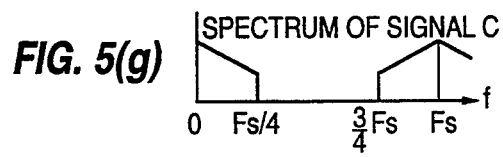

FIG. 5(h) WAVEFORM OF SIGNAL S

FIG. 5(i) WAVEFORM OF SIGNAL A
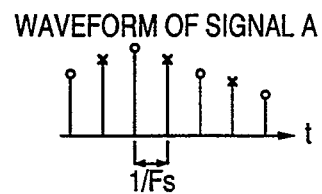

FIG. 5(j) WAVEFORM OF SIGNAL B
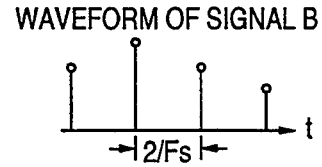

FIG. 5(k) WAVEFORM OF 0 INSERTED DATA
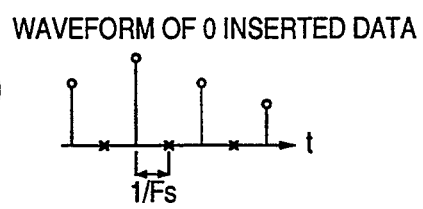

FIG. 5(l) WAVEFORM OF SIGNAL C

SUBSAMPLING METHOD AND INTERPOLATION METHOD OF DIGITAL SIGNALS

BACKGROUND OF THE INVENTION

1. Field of the Invention

This invention relates to a subsampling method in which the number of samples of a digital signal which is a sampled and quantized signal (including audio and various video signals) is reduced, an interpolation method in which the number of samples is increased by an inverse process, and a method of detecting additional information contained in the interpolated signal.

2. Description of the Prior Art

As a typically concrete example of the subsampling method and the interpolation method, a sampling rate converter is known. The subsampling method and interpolation method for this sampling rate converter has been reportedly proposed, for example, in the following investigations as; R. W. Schafer and L. R. Rabiner, "A Digital Signal Processing Approach to Interpolation", Proceedings of IEEE. Vol. 61, No. 6, PP. 692-702, June 1973, and S. Kato et al, "Digital Video Signal Processing in Home VTRs", IEEE Transactions in Consumer Electronics, Vol. CE-32, No. 3, PP. 372-378, August 1986.

FIG. 4(a) and FIG. 4(b) are respective block diagrams of a conventional subsampling apparatus in which the sampling rate is halved and a conventional interpolation apparatus which the sampling rate is doubled.

As shown in FIG. 4(a), this subsampling apparatus has an input terminal 401 of a signal A with a sampling rate of Fs, a digital low-pass filter 402, a subsampling switch circuit 403 for alternately removing an output sample of the digital low-pass filter 402, thereby obtaining a signal B, and an output terminal 404 for outputting the signal B whose sampling rate is Fs/2.

As shown in FIG. 4(b), this interpolation apparatus has an input terminal 405 for receiving the signal B, a zero insertion circuit 406 for inserting a sample having a value of zero in a one-by-one manner into the intermediate position of each sample data row of the signal B, a digital low-pass filter 407 for outputting an interpolated signal, and an output terminal 408 for outputting the interpolated signal.

With the subsampling apparatus and interpolation apparatus as arranged above, their operations will be explained below.

First, the operation of the subsampling apparatus shown in FIG. 4(a) will be explained. A signal having a sampling rate of F samples per time period has a frequency spectrum bisymmetric with respect to each frequency which is of an integral multiple of F, and the frequency band to be used ranges from zero to F divided by 2 (Nyquist's theorem). In order to have the sampling rate Fs of the signal A halved, or Fs/2, the frequency band thereof is required to be band-limited to the frequency band of 0 to Fs/4 in advance. As a result, the signal A is subjected by the band limitation to a value of 0 to Fs/4 by the filter 402, and samples are removed in a one-by-one manner by the subsampling switch circuit 403, thus obtaining the signal B whose sampling rate is Fs/2.

FIGS. 5(a)-5(l) is diagrams for explaining a generally used subsampling process and interpolation process which are commonly introduced into the embodiments of the prior art and this invention.

FIG. 5(a) is a spectrum diagram of an analog signal S. FIG. 5(b) is a spectrum diagram of a signal A obtained by sampling and quantizing the signal B with a frequency of Fs. FIG. 5(c) is an ideal frequency response diagram of a filter to be used the subsampling process FIG. 5(d) is a spectrum diagram of an output signal of the filter to be used for the subsampling process. FIG. 5(e) is a spectrum diagram of a signal B. FIG. 5(h) is a waveform diagram of the signal S. FIG. 5(i) is a waveform diagram of the signal A, and FIG. 5(j) is a waveform diagram of the signal B.

Next, the operation of the interpolation apparatus shown in FIG. 4(b) will be explained. The zero insertion circuit 406 inserts a sample having a valve of zero in a one-by-one manner between the adjacent samples, so that sampling rate of the signal B is doubled to be made Fs. However, the waveform of the signal thus obtained is similar to that of the signal B, and the spectrum thereof will be similar to that of the signal B. A signal of sampling rate F sample=Fs has a frequency spectrum bisymmetric with respect to each frequency which is of an integral multiple of Fs, so that referring to the output signal of the zero insertion circuit 407, a spectrum existing with a width of Fs/4 vertically about each frequency which is of an integral multiple of Fs is a pseudo spectrum, which means that it does not exist in the original signal A. As a result, the filter 407 removes the pseudo spectrum from the output signal of the zero insertion circuit 406 to obtain the interpolated signal with no distortion. The interpolated signal thus obtained is outputted from the terminal 408. FIG. 5(k) is a waveform diagram of an output signal of the zero insertion circuit 406. FIG. 5(f) is a frequency response diagram of a filter to be used for the interpolation process, and FIGS. 5(g) and 5(i) are respectively a spectrum diagram and a waveform diagram of an interpolated signal as an output signal of the filter to be used for the interpolation.

The digital filter 407 to be used for interpolation may comprise a shift register, a multiplier, an adder-subtracter or the like. An interpolation circuit effects a predetermined interpolation process using each sample of the input signal for increasing the number of samples, which can input to the zero insertion circuit and the digital filter to be used for the interpolation purpose.

However, it is impossible to realize such a filter that has an ideal frequency response as shown in FIG. 5(c) or FIG. 5(f) on an practical basis. Namely, the filters 402 and 407 which can be realized on a practical basis have a deviation from the ideal frequency response. In addition, in the filtering process, the sample value at any position is generally changed influenced by the sample value of an input positioned before or after of that any position, and an error due to the rounding of the operation results is generated. The repetition of the subsampling process and interpolation process for filtering purposes will cause a problem in that the deviation from the ideal frequency response and the generation of error due to the rounding operation will be accumulated to cause signal degradation to be further increased. On the other hand, if a subsampling apparatus and interpolation apparatus for which such a problem has been solved are practically realizable, audio, video or other signals whose copying is to be protected from the viewpoint of a protection of copyright can be copied with no degradation, which is also a problem to be solved. In addition, in spite of the fact that the interpolated signal has on increased sample data amount is compared to before interpolation, the data amount to be transmitted is increased, causing such a problem in that the transmission line is not applied effectively.

SUMMARY OF THE INVENTION

A first object of this invention is to provide a subsampling apparatus and an interpolation apparatus with no generation of accumulating signal degradation even if the subsampling process and interpolation process are repeated.

A second object of this invention is to provide a subsampling apparatus and an interpolation apparatus capable of controlling the accumulation of signal degradation due to the repetition of the subsampling process and the interpolation process.

A third object of this invention is to provide an interpolation method in which additional information is transmittable without increasing the transmission data amount of an interpolated signal and a detection method of the additional information.

In order to attain the above objects, an interpolation method of this invention receives a second signal which is a sampled and quantized signal as its input signal and increases the number of samples thereof, thereby obtaining a third signal. When a common sample position of the second signal and third signal is defined as a first group position, a plurality of interpolations can be effected including at least one or more kinds of interpolations such that the sample data of the second signal and the sample data of the third signal are characteristically equal to each other, and an interpolation selected in response additional information of the input signal is effected for the second signal, thereby obtaining the third signal.

Suppose that an uncommon sample position of the second signal and third signal is defined as a second group position. With the arrangement as shown above, in at least one kind of plural interpolations, the sample data of the second signal as the output are perfectly stored directly in the first group position of the third signal as the output, so that by selecting a predetermined interpolation to be effected, no generation of information loss and signal degradation due to the interpolation process results. In this case, if the subsampling process is to remove each sample at the second group position directly from the third signal, a perfect original second signal (a signal before interpolation process) can be obtained, so that the information loss and signal degradation of the second signal due to the subsampling process and interpolation process can be prevented from being generated.

In the receiving side of the third signal, whether or not the third signal is an interpolated signal to be obtained by effecting the predetermined interpolation can be detected by inspecting whether or not the sample data at the second group position is equal to the interpolated data obtained by effecting the predetermined interpolation. As a result, by switching the interpolation process method in response to the additional information, the additional information can be transmitted without increasing the transmission data amount thereof.

When the interpolation is selected so as to get the third signal of which the sample at the first group position is not perfectly equal to the sample of the second signal at the same position, information loss and signal degradation can be generated. Also, by sending information for directing the generation of signal degradation as additional information, the generation of signal degradation becomes possible in the subsampling process.

In order to attain the above objects, a detection method of additional information receives a third signal, as its input signal which is obtained by interpolating a second signal which is a sampled and quantized signal, thereby increasing the number of samples thereof, and defining that a common sample position and an uncommon sample position of the second signal and third signal are as a first group position and a second group position, respectively, comprises a step of effecting a predetermined interpolation using the sample data of the third signal at the first group position, thereby obtaining an interpolated data of the samples at the second group position, and a step for comparing the sample data of the third signal at the sample position of the interpolated data with the interpolated data, thereby detecting additional information buried in a first signal.

With the arrangement noted above, whether or not the third signal as the input is an interpolated signal obtained by applying to the second signal a predetermined interpolation such that the sample data of the second signal and the sample data of the third signal characteristically coincided with each other at the first group position can be judged, and the additional information can be detected by judging which interpolation is effected for obtaining the signal.

In order to attain the above objects, a subsampling method of this invention receives a first signal as its input signal and reduces the number of-samples thereof, thereby obtaining a second signal, in which, defining that a common sample position and an uncommon sample position of the first signal and a second signal are respectively a first group position and a second group position, the subsampling method comprises an interpolated signal detection step for obtaining a detected information by judging whether or not the first signal is an interpolated signal obtained by effecting a predetermined interpolation for the second signal, and a subsampling step wherein when the detected information shows that the first signal is first interpolated signal obtained by effecting a first predetermined interpolation to the second signal, a signal obtained by removing each sample at the second group position directly from the first signal is outputted as the second signal, and when the detected information shows that the first signal is not the first interpolated signal obtained by effecting the first predetermined interpolation to the first signal, a signal obtained by effecting a predetermined pre-processing to the first signal, thereby removing each sample thereof at the second group position, is outputted as the second signal.

With the arrangement as shown noted above when the first signal as its input is an interpolated signal, only the removal of each sample at the second group position is carried out, and no generation of signal degradation due to pre-processing results and the sample data of the first group position can be perfectly stored, so that generation of information loss and signal degradation due to pre-processing can be prevented. As a result, by combining the interpolation method and the subsampling method of this invention, no accumulation of signal degradation results even if the subsampling process and interpolation process are repeated.

If the above-mentioned interpolation method is to multiplex an interpolated signal with additional information for directing the generation of signal degradation, the interpolated signal detection step performs the same process as in the detection method of the additional information, detects the additional information, and outputs the detected information. In the subsampling step the generation of signal degradation is controlled by the detected information in the pre-processing, so that accumulation of signal degradation due to the repetition of the subsampling process and the interpolation process can be controlled.

BRIEF DESCRIPTION OF THE DRAWINGS

FIG. 5(a)–5(l) is waveform and frequency characteristic diagrams by signal and process in the subsampling process and the interpolation process which are commonly employed in the prior art and this invention.

FIG. 5(a) is a spectrum diagram of an analog signals.

FIG. 5(b) is a spectrum diagram of a signal A obtained by sampling the analog signal S with a frequency of Fs.

FIG. 5(c) is a diagram showing an example of an ideal frequency response of a filter for the subsampling process.

FIG. 5(d) is a spectrum diagram of an output signal of the filter for the subsampling process.

FIG. 5(e) is a spectrum diagram of a signal B as an output signal in the subsampling process or an input in the interpolation process, or an output signal of a zero insertion circuit.

FIG. 5(f) is an ideal frequency response of a filter for the sample removing process.

FIG. 5(g) is a spectrum diagram of an interpolated signal.

FIG. 5(h) is a waveform diagram of the analog signal S prior to being sampled and quantized.

FIG. 5(i) is a waveform diagram of the signal A obtained by sampling the signal S with a frequency of Fs.

FIG. 5(j) is a waveform diagram of the signal B obtained by subsampling the signal A.

FIG. 5(k) is a waveform diagram of a signal obtained by inserting a sample having a data value of zero between the adjacent samples of the signal B.

FIG. 5(l) is a waveform diagram of an interpolated signal C.

DETAILED DESCRIPTION OF THE PREFERRED EMBODIMENTS

Figure 1A:
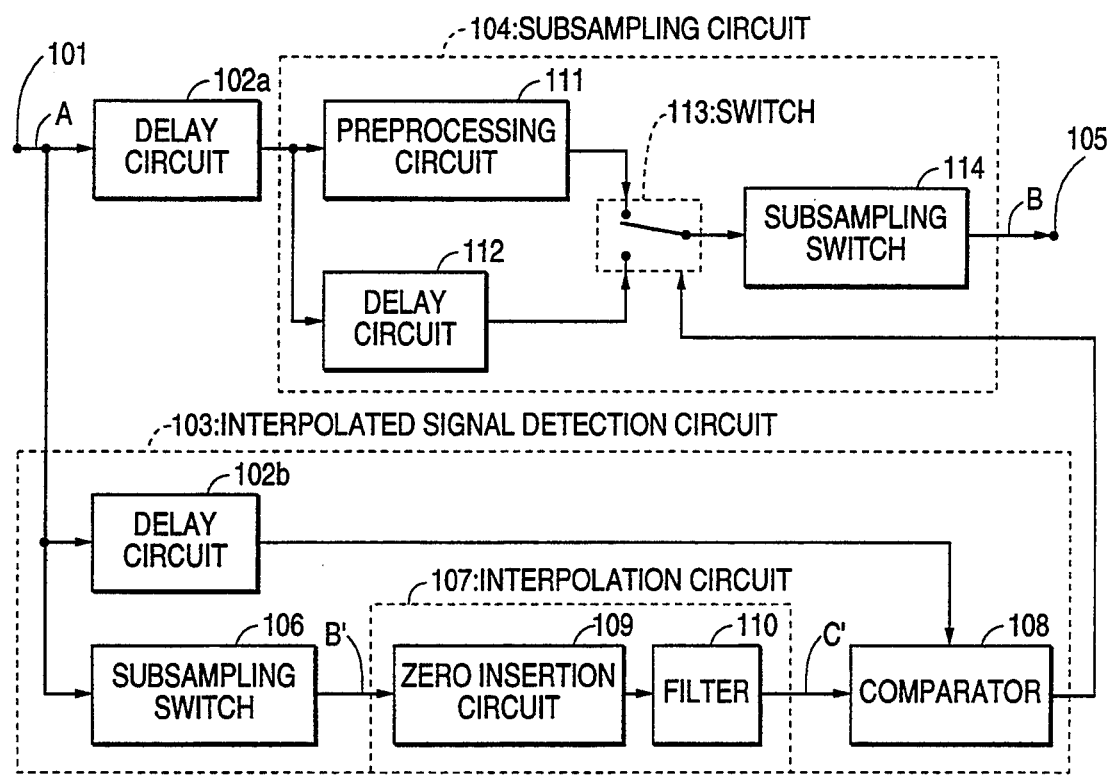
FIG. 1(a) is a block diagram of a subsampling apparatus according to a first embodiment of this invention.

FIG. 1(a) and (b) are respective block diagrams of a subsampling apparatus and an interpolation apparatus according to a first embodiment of this invention.

This subsampling apparatus receives a digital signal A which is obtained by sampling and quantizing a signal with a sampling rate of Fs as its input signal, removes the sample of the signal A so as to halve the-number of samples thereof and outputs a signal B with a sampling rate of Fs/2.

An the other hand, this interpolation apparatus receives the signal B with the sampling rate of Fs/2 as its input, adds new samples which are obtained by interpolation using samples of the signal B, and outputs a signal C with a sampling rate of Fs. That is, the interpolation apparatus is to carry out the inverse conversion to the subsampling apparatus. The signal C may be inputted to the subsampling apparatus again, and in this case, the signal A is equal to the signal C.

Hereinafter, a common sample position and an uncommon sample position of the signal A (or the signal C) and the signal B are respectively defined as a predetermined Y and a predetermined X. The signals A, B and C are defined as a first signal, a second signal and a third signal, and the predetermined positions Y and X are respectively defined as a first group position and a second group position.

In FIG. 1(a), the subsampling apparatus has an input terminal 101 for receiving the signal A, delay circuits 102a and 102b for timing adjustment, an interpolated signal detection circuit 103 for judging whether or not the signal A is the signal C and for outputting the detected information, a subsampling circuit 104 for converting the input signal A into the signal B whose number of samples is half that of the input signal A, an output terminal 105 for outputting the signal B, a subsampling switch circuit 106 for removing samples alternately directly from the signal A, thereby obtaining a signal B' having samples only at the predetermined position Y, an interpolation circuit 107 for effecting the same interpolation as that of the interpolation apparatus for the signal B', thereby obtaining a signal C', a comparator 108 for comparing the sample data of the signal C' and the sample data of the input signal A at the predetermined position X and outputting the detected information, a zero insertion circuit 109 for inserting a sample whose data value is zero into the predetermined position X of the signal B', a digital filter 110 for effecting a predetermined interpolation for an output of the zero insertion circuit 109, thereby obtaining the signal C', a pre-processing circuit 111, a delay circuit 112 for timing adjustment, a switch circuit 113 for receiving an output of the filter 111 and an output of the delay circuit 112 and selecting one of the two inputs in response to the detected information, and a subsampling switch circuit 114 for removing the sample data of an output of the switch circuit 113 at the predetermined position X, thereby obtaining the signal B.

Figure 1B:
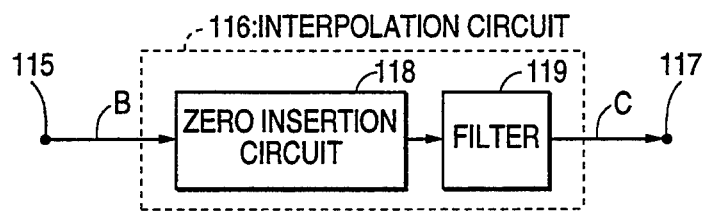
FIG. 1(b) is a block diagram of an interpolation apparatus according to a first embodiment of this invention.

In FIG. 1(b), this interpolation apparatus has an input terminal 115 for receiving the signal B, an interpolation circuit 116 for receiving the signal B and outputting the signal C whose number of samples doubles that of the signal B, an output terminal 117 for outputting the signal C, a zero insertion circuit 118 for inserting a sample whose data value is zero into the predetermined position X of the signal B, and a digital filter 119 for effecting a predetermined interpolation for an output of the zero insertion circuit 118.

The interpolation circuit 107 (including the zero insertion circuit 109 and the filter 110) in the interpolation apparatus and the interpolation circuit 116 (including the zero insertion circuit 118 and the filter 119) are equal in arrangement and characteristic to each other.

With the subsampling apparatus and interpolation apparatus arranged as above, their operations will be explained below referring to FIGS. 1(a)-1(d) and 5(a)-5(l).

Figure 4A:
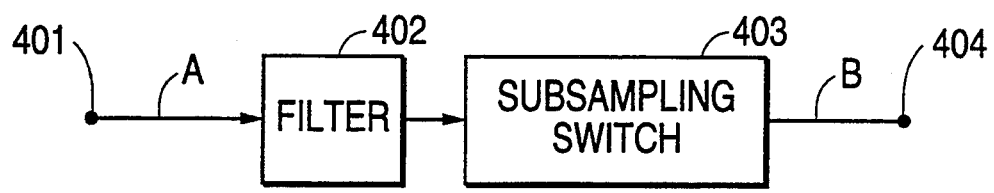
FIG. 4(a) is a block diagram of a subsampling apparatus of the prior art.
Figure 4B:
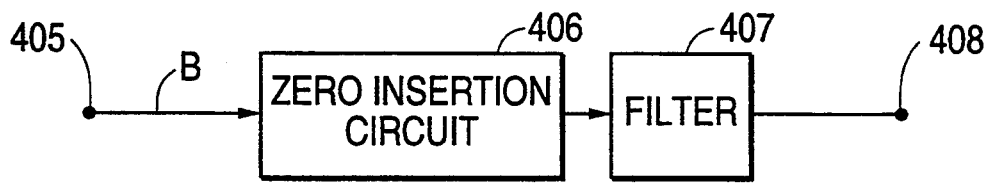
FIG. 4(b) is a block diagram of an interpolation apparatus of the prior art.

For the sake of simplifying the explanations, the operation of the interpolation apparatus will be explained first. The basic structure of the interpolation apparatus of this embodiment is the same as that of the conventional interpolation apparatus shown in FIG. 4(a). Namely, in FIG. 1(b), the signal B of a sampling rate of Fs/2 which is inputted from the terminal 115 has samples only at the predetermined positions Y (FIG. 5(j)). A new sample whose data value is zero is inserted into the intermediate position between the adjacent samples, or into the predetermined positions X in the zero insertion circuit 118, thereby obtaining a signal whose sampling rate is Fs (FIG. 5(k)). As shown in FIG. 5(e), however, it has unneccessary frequency components in the range of Fs/4 to Fs/2 of the transmission frequency band, so that these unnecessary frequency components are removed by the filter 119. As a result, the signal C with no aliasing noise can be obtained and outputted from the terminal 117.

The difference between any interpolation apparatus of the prior art and the interpolation apparatus of this embodiment is in the interpolation process. The feature of the interpolation process effected by the interpolation circuit 116 is that the sample data of the input signal B and that of the output signal C are equal to each other at the common sample positions of the input signal B and the output signal C, or the predetermined positions Y. As a result, in the interpolation circuit 116, the sample data of the input signal B at the predetermined positions Y pass therethrough without being influenced by the interpolation process. Each of the sample data of the input signal B is directly and perfectly stored at the predetermined position Y of the output signal C, and the following two features are possessed;

The signal C has all of the information of the signal B, and an information loss never occurs through this interpolation process.

The subsampling process for the signal C, that is, the process for obtaining the signal B from the signal C may remove only all of the samples of the signal C at the predetermined positions X, and the information loss and/or signal degradation is never due to this process.

Accordingly, if the subsampling process can achieve only a process in which the input signal A is processed for the signal C being subjected to this interpolation process so as to remove only the samples at the predetermined positions X of the signal C, even when the subsampling process and this interpolation process are repeated, the sample data of the signal C at the predetermined positions Y are always stored, resulting in no generation of an accumulation of signal degradation.

Next, an explanation follows on the method of effecting interpolation in which the sample data at the predetermined position Y are riot varied, concretely, on the arrangement of the digital low-pass filter 119.

For the sampling rate conversion, a FIR type digital filter is generally used which is stably operable and suitable for high speed operation. If the input sample data at a sample position i is expressed as Di, and the output data of the filter is expressed as Fi, the input-output relationship of the FIR type digital filter of (2N+1) tap can be shown by the following equation;

$$Fi = Ao \cdot Di + \sum_{k=1}^{+N} Ak \cdot (D_{i-k} + D_{i+k}) \quad (1)$$

where, k is an integer, and Ak is a predetermined coefficient.

The coefficient is symmetric with respect to the position i, and the filter has a linear phase characteristic with no waveform distortion.

The fact that the sample data of the predetermined positions Y are not varied before and after the interpolation process means that when the position i is the predetermined position Y, the following equation can be established;

$$Fi = Di \quad (2)$$

In addition, the sample data of an input of the filter at the predetermined positions X are zero. Thus, the conditions under which Eg. (2) is to be established become as follows;

$$A_0 = 1, \text{ and } A_2 = A_4 = A_6 = \cdots = 0 \quad (3)$$

As a result, by substituting Eg. (3) into Eg. (1), the input-output relationship of the digital filter with no variation in sample data of the predetermined positions Y becomes as follows;

$$Fi = Di + \sum_{j=0}^{+M} Bj (D_{i-2j-1} + D_{i+2j+1}) \quad (4)$$

where, N=2M+1, M is an integer and Bj is a coefficient.

When the position i is the predetermined position Y, the second term of Eg. (4) becomes zero, and Fi=Di is obtained, and when the position i is the predetermined position X, Di=0, and Eg. (4) becomes as follows;

$$Fi = \sum_{j=0}^{+M} Bj \cdot (D_{i-2j-1} + D_{i+2j+1}) \quad (5)$$

(N+1) input data existing before and after the position i are used for interpolation.

The coefficients {$A_0, A_1, A_2 \cdots A_N$} of a low-pass filter satisfying the above condition are exemplified as follows (provided shown by the representation form of Eg (1));

{1, 37/64, 0, −5/64}

{1, 39/64, 0, −9/64, 0, 2/64}

{1, 79/128, 0, −20/128, 0, 7/128, 0, −2/128}

The frequency responses of these filters (gain 2) are respectively expressed as $Q_1, Q_2$ and $Q_3$ and shown in FIG. 3 (a). By increasing the number of taps of the filter, the frequency response can more closely approach the ideal frequency response as shown in FIG. 5(f). Also, the simplest example of the coefficient is {1, ½}. In this case, the sample data of the predetermined position X is a mean value of the two sample data of the predetermined position Y before and after the predetermined position X.

Figure 3A:
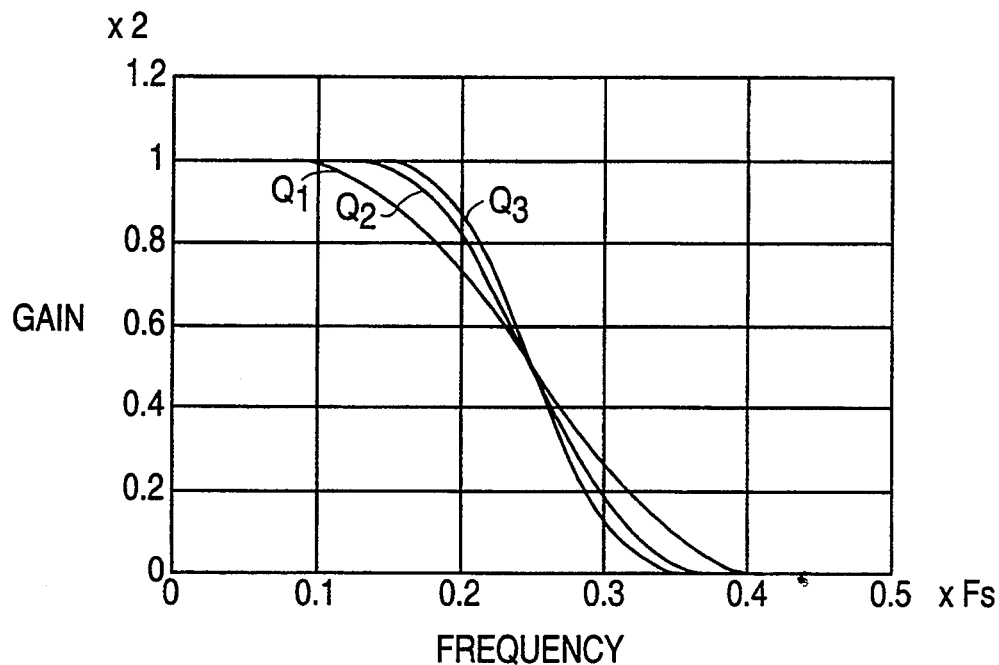
FIG. 3(a) is a diagram showing an example of a frequency response of a digital filter 119 for interpolation shown in FIG. 1(b).
Figure 3B:
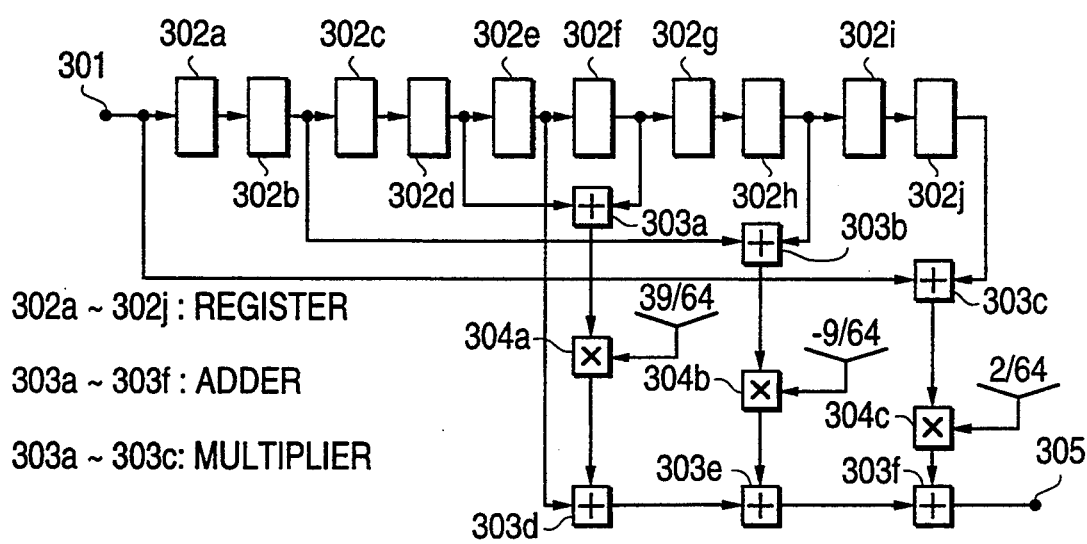
FIG. 3(b) is a block diagram of the digital filter 119 for interpolation shown in FIG. 1(b).

FIG. 3(b) is a block diagram of the filter 119 when the frequency response is shown by the $Q_2$ in FIG. 3(a). In FIG. 3(b), the filter 119 has an input terminal 301, registers 302a to 302j each store one unit of sample data and transmit the data successively to the next step in synchronism with a sampling clock, adders 303a to 303f, multipliers 304a to 304c for multiplying 39/64, −9/64 and 2/64, respectively and an output terminal 305.

The description of the operation thereof has been omitted here because it is similar to the operation of a generally used digital filter.

Prior to the explanation of the operation of the subsampling apparatus of this embodiment, its principle will be explained.

With the interpolation apparatus of this embodiment, as already described above, the signal C obtained by the interpolation circuit 116 has the sample data of the signal B stored at the predetermined positions Y, no information loss due to interpolation process results, and only the removal at the sample of the predetermined positions X, so that the subsampling process can be effected with no information loss. As a result, in the subsampling process, if a judgement is made as to whether or not the signal A is the signal C, the accumulation of signal degradation resulting from repeating the subsampling process and interpolation process can be perfectly prevented. That is, if the signal A is the signal C obtained by the interpolation circuit 116, the signal from which all of the samples at the predetermined positions X are removed directly may be outputted as the signal B.

If the signal A is not the signal C, similar to the subsampling process of the prior art, the frequency components ranging in band from Fs/4 to Fs/2 which cannot be transmitted at the sampling rate of Fs/2 are removed therefrom, and thereafter, the signal obtained by removing the sample at the predetermined positions X may be outputted as the signal B.

Then, the detection principle of the signal C will be explained. First, each sample of the input signal A at the predetermined position X is removed to obtain the signal B', and subjected to the same interpolation process of the signal B' as in the interpolation circuit 116 to obtain the signal C'. In this case, if it is judged that, the signal A is the signal C, the signal B' is equal to the signal B, and the signal C' thus obtained becomes equals to the signal C, or the signal A. This is because the input signal B of the interpolation circuit 116 can be obtained only by removing the sample at the predetermined positions X directly from the signal C which is the output signal of the interpolation circuit 116. As a result, if the signal A is equal to the signal C', the signal A can be judged to the equal to the signal C. In addition, the sample data of the signal A and those of the signal C' always become equal at the predetermined positions Y, only the sample data of the predetermined positions X may be compared.

Next, the operation of the subsampling apparatus of this embodiment will be explained by referring to FIG. 1(a). In FIG. 1(a), the signal A inputted from the terminal 101 is inputted to the interpolated signal detection circuit 103 and inputted via the delay circuit 102a to the subsampling circuit 104.

First, the operation of the interpolated signal detection circuit 103 will be explained. The signal A has the samples at the predetermined positions X removed by the subsampling switch circuit 106 to become the signal B' having the samples at the predetermined positions Y only. The signal B' is subjected to the same interpolation process as in the interpolation circuit 116 by the interpolation circuit 107 to obtain the interpolated signal C'. The zero insertion circuit 109 and the digital filter 110 of the interpolation circuit 107 are equal to the zero insertion circuit 118 and the digital filter 119 of the interpolation circuit 116, respectively.

The comparator 108 compares the signal C' with the signal A timing-adjusted by the delay circuit 102b. If the two signals coincide with each other, the signal A is judged to be the output signal C of the interpolation circuit 116 and the thus judged result is outputted as the detected information. The output of the comparator 108 can be obtained for every sample at the predetermined positions X. The compared result is preserved until getting the next result and then is outputted.

The principle of the interpolated signal detection circuit is noted below. If the signal A is the signal C, all of the samples of the signal B are stored at the predetermined positions Y of the output signal C of the interpolation circuit 116, so that the signal B' becomes equal to the signal B. If the signal B' is equal to the signal B, since the interpolation circuit 107 and the interpolation circuit 116 perform the same process, the obtained signal C' becomes equal to the signal C. As a result, if the signal A is equal to the signal C', the signal A can be judged to be the signal C. Next, the operation of the subsampling circuit 104 is explained below. The subsampling circuit 104 effects different processes depending on the detected information from the interpolated signal detection circuit 103. If the detected information shows that the signal A is the signal C, the switch circuit 113 selects an output of the delay circuit 112. So, the signal A from the terminal 101 is inputted via the delay circuits 102a and 112 for timing adjustment and switch circuit 113 directly to the subsampling switch circuit 114. In the subsampling switch circuit 114, each sample of the signal A at the predetermined positions X is removed and the signal thus obtained is outputted from the terminal 105 as the signal B. As a result, if the signal A is the signal C subjected to a predetermined interpolation process, each sample of the signal A at the predetermined positions Y is directly outputted to become the signal B, so that no generation of information loss and signal degradation in combination with the interpolation circuit 116 results. Referring to the signal B, the sample at the predetermined positions Y is always passed therethrough in combination with the interpolation circuit 116 and this subsampling processing apparatus, which means that even if the interpolation process and subsampling process are repeated, no generation of information loss, signal degradation and its accumulation is obtained.

On the other hand, if the detected information shows that the input signal A is not the signal C, the switch circuit 113 selects an output of the pre-processing circuit 111, so that similar to the conventional subsampling process, the signal A inputted via the delay circuit 102a from the terminal 101 is subjected to a frequency band limitation by the pre-processing circuit 111 and sent to the subsampling switch circuit 114. In the pre-processing circuit 111, the frequency band becoming an aliasing noise, or the frequency band (ranging from Fs/4 to Fs/2) which cannot be transmitted at the sampling rate of Fs/2 is removed. The signal A thus pre-processed has the sample at the predetermined positions X removed and then, the resultant signal is outputted from the terminal 105 as the signal B. As a result, the signal B with no aliasing noise can be obtained.

Figure 1C:
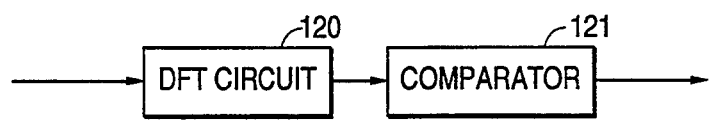
FIG. 1(c) is a block diagram of an interpolated signal detection circuit showing another example of the interpolated signal detection circuit shown in FIG. 1(a).

FIG. 1(c) is a block diagram of an interpolated signal detection circuit showing another example of the interpolated signal detection circuit 103 shown in FIG. 1 (a). The functions of this circuit are the same as those of the circuit 103, but different in the detection principle of an interpolated signal therefrom.

In FIG. 1(c), element 120 is a DFT circuit for separating unnecessary frequency band components (Fs/4 to Fs/2) and element 121 is a comparator for outputting the detected information. The DFT circuit 120 outputs the unnecessary frequency components (Fs/4 to Fs/2) of the frequency components of the signal A, which cannot be transmitted at the sampling rate of Fs/2. The comparator 121 compares the magnitude of each of the unnecessary frequency components with a predetermined value, and if it is smaller than the value, judges that the signal A is an interpolated signal and outputs the detected information.

The interpolated signal detection circuit of this example detects the interpolated signal using such a characteristic that an interpolated signal has only transmittable frequency band components (0 to Fs/4) of the signal B before being subjected to interpolation process.

The DFT circuit 120 obtains a signal substantially proportional to the energy of the unnecessary frequency band component, and in this example, it is a discrete Fourier transform circuit. Instead of using the discrete Fourier transform circuit, it can be arranged such that a filter for separating the unnecessary frequency band components and a non-linear circuit for converting the energy of a unnecessary frequency band component into a signal substantially proportional thereto such as a squaring circuit, an absolute value circuit and the like are connected in series. In this case, the filter has an inverse characteristic to that of the pre-processing circuit 111 for removing the unnecessary frequency band components, and a part of which can be used in common. Also, referring to the comparison method in the comparator 121, instead of the method of comparing each of the unnecessary frequency components (Fs/4 to Fs/2) with a predetermined value, a method in which the unnecessary frequency components (Fs/4 to Fs/2) and the necessary frequency components (0 to Fs/4) to be transmitted are relatively compared may be used and furthermore, both methods may be used in combination.

There may be a case in which the signal A does not have the unnecessary frequency band components (Fs/4 to Fs/2) even if it is not an interpolated signal, but in this case, no generation of aliasing noise can be obtained even if not subjected to the frequency band limitation by the pre-processing circuit 111. In addition, as no generation of signal degradation due to the filter can be obtained, the signal degradation can be correspondingly further reduced. Also, the interpolated signal detection circuit of this example can detect not only the interpolated signal C obtained by a predetermined interpolating process, but also any interpolated signal not having unnecessary frequency components. In this case, there is no signal degradation due to the repetition of the subsampling process and the interpolation process by combining the subsampling apparatus in which the interpolated signal detection circuit of this example is used with the interpolation apparatus shown in FIG. 1(b).

As explained above, the combined use of the subsampling apparatus and interpolation apparatus of this embodiment makes it possible even if the subsampling process and interpolation process are repeated, for the sample data at the predetermined positions Y after the first interpolation process to be perfectly stored, and no accumulation of signal degradation results and even if the input signal A is a signal having the interpolated signal C and another signal (for example, a combined signal by editing or the like), only the other signal is subjected to frequency band limitation, and the signal degradation can be minimized.

In this embodiment, the interpolation circuit comprises the zero insertion circuit and the digital filter, but it is not limited thereto, the arrangement for effecting a predetermined interpolation using the sample data of an input signal at the predetermined positions Y so as to thereby obtain an interpolated signal can be considerably varied. Similarly, the subsampling circuit 104 can be vary in arrangement. In addition, the coefficient of the multiplier of the filter for the interpolating process is fixed, but it is not limited thereto, it may be satisfactory if the sample value at the predetermined positions Y is not changed and it may be arranged so as to switch the coefficient adaptively. For example, when the signal to be processed is a video color difference signal, using the correlation of the luminance and color difference signals, the coefficient of the signal to be processed, and of the coefficient of the color difference signal may be changed in response to the change of the luminance signal.

As described above, in the first embodiment of this invention, the combination of the subsampling apparatus and the interpolation apparatus with no generation of signal degradation due to the repetition of the subsampling process and the interpolation process is explained. Accordingly, if a transmission apparatus or a recording apparatus having the subsampling apparatus of this embodiment and a receiving apparatus or a reproducing apparatus having the interpolation apparatus of this embodiment are combined, a transmission and receiving apparatus and a recording and reproducing apparatus can be practically realized which do not cause signal degradation due to the repetition of transmitting and receiving processes or recording and reproducing processes.

However, if no generation of signal degradation results, there may arise another problem, which is related to the copyright protection. This is because in spite of the fact that it must be closely protected, the audio and video signals to be protected from being copied can be copied with no generation of degradation. In order to overcome this problem, a second embodiment of this invention will be processed here.

Figure 2A:
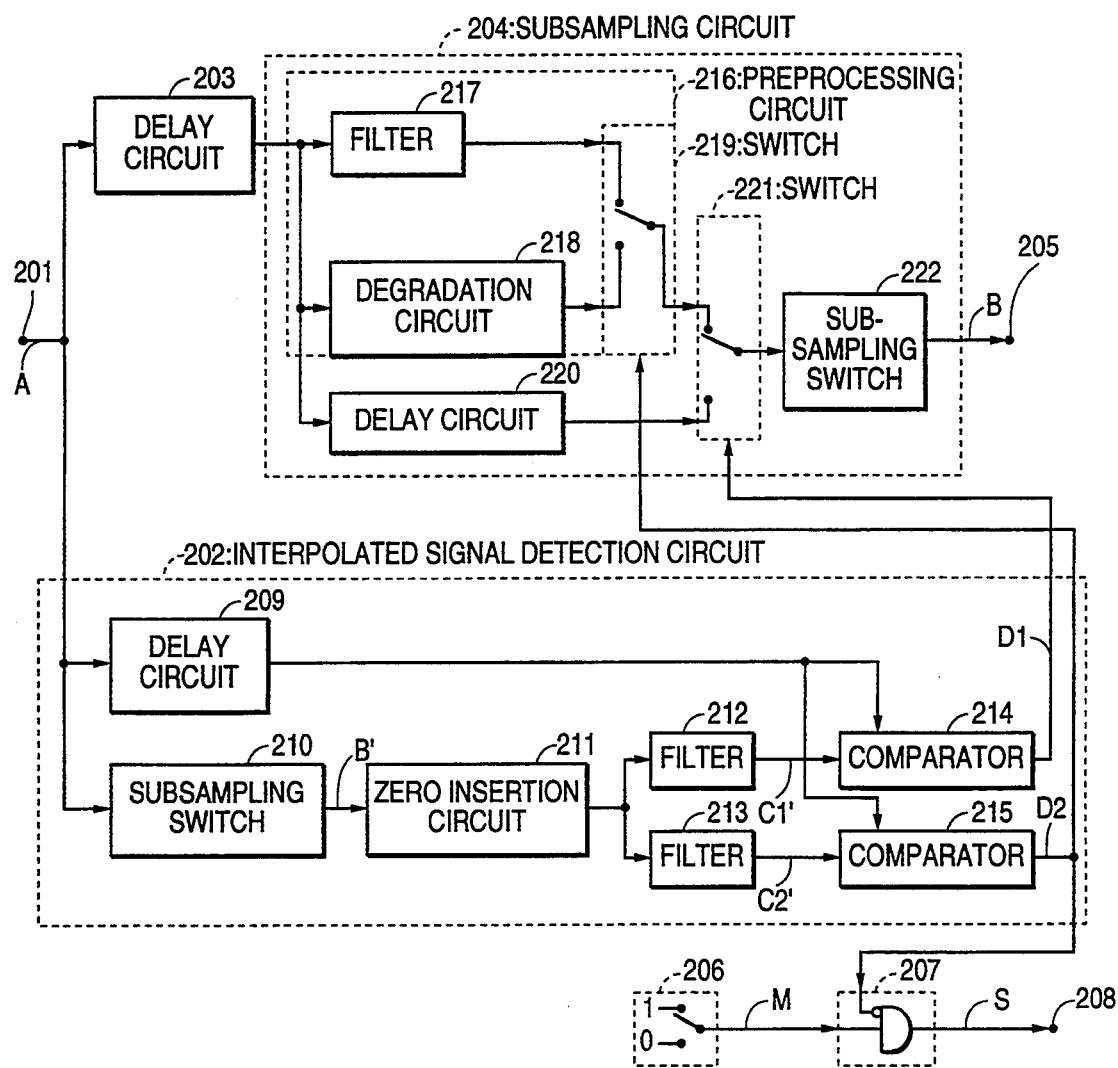
FIG. 2 (a) is a block diagram of a subsampling apparatus according to a second, embodiment of this invention.
FIG. 2(b) is a block diagram of an interpolation apparatus according to a second embodiment of this invention.

FIG. 2 (a) and (b) are block diagrams of a subsampling apparatus and an interpolation apparatus in which a subsampling method, interpolation method and detection method of additional information according to this invention is introduced, respectively. Similar to the first embodiment, the subsampling apparatus of the second embodiment converts the signal A with the sampling rate of Fs into the signal B with the sampling rate of Fs/2. And the interpolation apparatus of this embodiment effects a predetermined interpolation and converts the signal B into the signal C with the sampling rate of Fs. In this case, similar to the first embodiment, a common sample positions and an uncommon sample positions of the signal A (or the signal C) and the signal B are defined as a predetermined positions Y and a predetermined positions X, respectively. In FIG. 2 (a), this subsampling apparatus has an input terminal for receiving the digital signal A with the sampling rate of Fs, an interpolated signal detection circuit 202 for judging whether or not the signal A is an interpolated signal $C_1$ or $C_2$, thereby outputting detected information $D_1$ or $D_2$, a delay circuit 203 for timing adjustment, a subsampling circuit 204 for converting the signal A into the signal B whose number of samples is half that of the signal A, an output terminal 205 of the signal B, a switch circuit 206 for generating a mode direction information M for directing the generation of signal degradation due to the repetition of the subsampling process and interpolation process of the signal B, an additional information generation circuit 207 for generating additional information S, an output terminal 208 for outputting the additional information S, a delay circuit 209 for timing adjustment, a subsampling switch circuit 210, a zero insertion circuit 211, digital filters 212 and 213 for interpolation, a comparator 214 for outputting the detected information $D_1$, a comparator 215 for outputting the detected information $D_2$, a pre-processing circuit 216, a digital filter 217 for subsampling, a signal degradation circuit 218, a switch circuit 219 for selecting an output of the filter 217 or an output of the signal degradation circuit 218 in response to the detected information $D_2$ a delay circuit 220 for timing adjustment, a switch circuit 221 for selecting an output of the switch circuit 219 or an output of the delay circuit 220 in response to the detected information $D_1$ and a subsampling switch circuit 222 for removing the sample of the output of the switch circuit 221 at the predetermined positions X thereby obtaining the signal B.

Figure 2B:
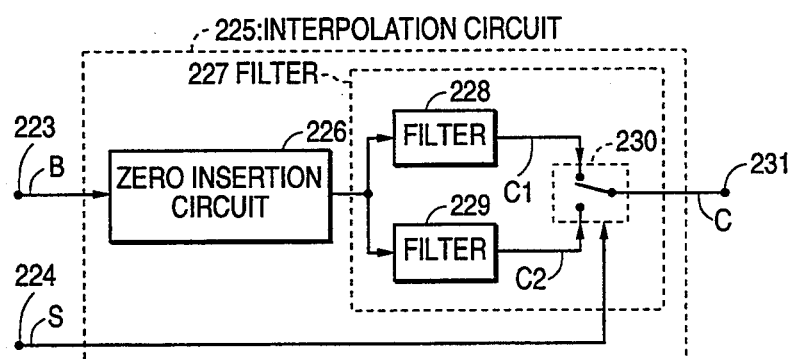

In FIG. 2(b), this interpolation apparatus has an input terminal 223 for the signal B, an input terminal 224 for receiving the additional information S, an interpolation circuit 225, a zero insertion circuit 226, a digital filter 227 for effecting a predetermined interpolation of an output of the zero insertion circuit 226 and for outputting the interpolated signal C, a digital filter 228 for effecting a first predetermined interpolation, thereby obtaining the interpolated signal $C_1$, a digital filter 229 for effecting a second predetermined interpolation, thereby obtaining the interpolated signal $C_2$, a switch circuit 230 for selecting the interpolated signal $C_1$ or $C_2$ in response to the additional information B from the terminal 224 and for outputting the signal C, and an output terminal 231 for outputting the signal C.

The additional information S is information for controlling the generation of the information loss of the signal B when repeating the subsampling process and interpolation process, or the generation or degradation of the signal B. If the additional information S and the signal B both are being recorded in an recording medium, it is an information whose copyright is to be protected. The additional information S is one bit information, in which it is assumed that $S=1$ means permission to perfectly copy the signal B and $S=0$ means the prohibition of perfectly copying the signal B. The mode direction information M is one bit information as well, and the contents to be meant are the same as above.

With the subsampling apparatus and interpolation apparatus arranged as above, their operation will be explained below. First, the operation of the interpolation apparatus will be explained.

In the interpolation apparatus, the,signal B and the additional information S obtained from a transmission line (or a recording medium) are fed to the terminals 223 and 224, respectively. In the interpolation circuit 225, the zero insertion circuit 226 inserts the sample whose data value is zero into the predetermined positions X of the signal B, thereby doubling the number of samples, and the filter 227 effects a predetermined interpolation for removing unnecessary frequency components existing in the transmittable frequency band, thereby obtaining the interpolated signal C which is outputted from terminal 231. In the filter 227, when $S=1$, the switch circuit 230 selects the signal $C_1$ of the filter 228 for effecting the first predetermined interpolation, so that the signal $C_1$ becomes the signal C, and when $S=0$, the switch circuit 230 selects the signal $C_2$ of the filter 229 for effecting the second predetermined interpolation, so that the signal $C_2$ becomes the signal C.

The filters 228 and 229 respectively effect interpolation with no change in sample data of the predetermined positions Y similar to the case of the first embodiment, so that the signals $C_1$ and $C_2$ both can be converted into the signal B with no information loss by directly removing each sample at the predetermined positions X thereof. The filters 228 and 229 have different interpolation operation characteristics, and the sample values of the signals $C_1$ and $C_2$ at the predetermined positions X are generally different from each other. As a result, on the side of receiving the signal C, by inspecting the sample data thereof at the predetermined positions X, whether the signal C is the signal $C_1$ or the signal $C_2$ can be judged. The selection of the signal $C_1$, and signal $C_2$ is made in response to the additional information S, so that by judging whether the signal C is the signal $C_1$ or signal $C_2$, the additional information S can be taken out from the interpolated signal C. That is, the interpolation circuit 225 is apparatus for multiplexing additional information without increasing the amount of data the signal C. The additional information S is buried in the signal C. The method of separating the additional information therefrom will be shown in detail later.

In addition, the signal $C_1$ and signal $C_2$ may coincide with each other at the predetermined positions X and, in this case, a method in which the additional information S is determined on a majority decision basis using the judgement results at the other predetermined positions X before and after on the receiving side, and a method in which when the signal $C_1$ and signal $C_2$ coincide with each other on the interpolation process side, the data of one of the two signals is processed, for example, a method of forcibly increasing an output of one of the two signals by one, may be employed for properly detecting the additional information S.

In this subsampling apparatus, the signal A from the input terminal 201 is sent to the interpolated signal detection circuit 202 and sent via the delay circuit 203 to the subsampling circuit 204. In the interpolated signal detection circuit 202, each sample of the signal a is removed at the predetermined positions X by the subsampling switch circuit 210 to obtain the signal B' whose number of samples is half that of the signal A. The signal B' is subjected to the insertion of samples whose data are zero into the predetermined positions X by the zero insertion circuit 211 to double the number of samples and sent to the filters 212 and 213. The comparator 214 compares the interpolated signal $C_1'$ outputted from the filter 212 with the signal A passed through the delay circuit 209 and the result thus obtained is outputted as the detected information $D_1$. The detected information $D_1$ is one bit information, and when the signal C is the signal $C_1$, it becomes one. The comparator 215 compares the interpolated signal $C_2'$ outputted from the filter 213 with the signal A passed through the delay circuit 209 and the result thus obtained is outputted as the detected information $D_2$. The detected information $D_2$ is one bit information, and when the signal C is the signal $C_2$, it becomes one. The comparators 214 and 215 each may compare the signals only at the predetermined positions X similar to the case of the comparator 108.

The interpolated signal detection circuit 202 also shows an example of the method of separating the additional information (detected information). Namely, by the zero insertion circuit 211 and the filters 211 and 213, the interpolated data at the predetermined positions X obtained by effecting a predetermined interpolation using the sample data of the input signal A at the predetermined positions Y is determined, and the interpolated data thus obtained and the sample data of the signal A at the predetermined positions X are compared in the comparators 214 and 215, thus the additional information S buried in the signal C is separated therefrom and outputted as the detected information $D_1$ and $D_2$, respectively.

In the subsampling circuit 204, the signal A passed through the delay circuit 203 is sent to the delay circuit 220, the filter 217 and the signal degradation circuit 218 in the pre-processing circuit 216. The subsampling circuit 204 selects the process to be effected in response to the detected information $D_1$ and $D_2$. As a result, the operation will be explained by separating the case according to the combination of the detected information $D_1$ and $D_2$. When $(D_1, D_2)=(1, 0)$, namely, when the signal A is the interpolated signal $C_1$ and the mode is of the permissible perfect copying (S=1), the signal A passed through the delay circuit 203 is passed through the delay circuit 220 and the switch circuit 221 and sent to the subsampling switch circuit 222 for removing each sample at the predetermined positions X to obtain the signal B and outputted it from the terminal 205. In the additional information generation circuit 207, when $D_2=0$, the mode direction information M from the switch circuit 206 is directly sent as the additional information B to the output terminal 208 and is outputted. As a result, when the input signal A is the signal $C_1$, the subsampling can be performed while generating no information loss to thereby obtain the signal B. The additional information S transmitted with the signal B becomes equal to the mode direction information M from the switch circuit 206. That is, if M=1, S=1, there is no generation of information loss and degradation of the signal B due to the repetition of the subsampling process and the interpolation process. On the other hand, if M=0, S=0, then the mode for prohibiting the perfect copying of the signal B occurs, which means that the accumulation of signal degradation will occur from the next subsampling process.

When $(D_1, D_2)=(0, 1)$, namely, when the signal A is the interpolated signal $C_2$ and the mode is of the prohibition of perfect copying (S=0), the signal A passed through the delay circuit 203 is degraded in the signal degradation circuit 218, and then sent to the switch circuits 219 and 221 and sent to the subsampling switch circuit 222 for removing each sample at the predetermined positions X to obtain the signal B, and the signal B thus obtained is outputted from the terminal 205. In the additional information generation circuit 207, when $D_2=1$, the mode direction information M from the switch circuit 206 is ignored and the additional information S is forcibly made zero and is outputted. The additional information S=0 is always held even when the subsampling process and interpolation process are repeated, so that the signal degradation is accumulated in each repetition of the two processes.

When $(D_1, D_2)=(0, 0)$, namely, when the signal A is not the interpolated signal $C_1$ nor $C_2$ and the additional information S is not buried therein, the signal A passed through the delay circuit 203 is sent to the filter 217 for removing the frequency components (Fs/4 to Fs/2) not transmittable with the sampling rate of Fs/2, passed through the switch circuits 219 and 221 and sent to the subsampling switch circuit 222 for removing each sample at the predetermined positions X to obtain the signal B and the signal B thus obtained is outputted from the terminal 205. In the additional information generation circuit 207, the mode direction information M from the switch circuit 206 directly becomes the additional information S and is outputted from the terminal 208. As a result, when the signal A is not the interpolated signal $C_1$, nor $C_2$, then the signal B with no aliasing noise can be obtained. The additional information S transmitted with the signal B becomes equal to the mode direction information M from the switch circuit 206. Accordingly, if M=1, S=1, so that no generation of signal degradation and information loss of the signal B results even when the subsampling process and the interpolation process are repeated. If M=0, S=0, then the mode of it being permissible to perfectly copy the signal B occurs, and the accumulation of signal degradation of the signal B occurs in each repetition of the subsampling process to be followed. In addition, a case may occur in which the signal A generates a sample which is misjudged as the interpolated signal $C_1$, or $C_2$; however, in this case, by applying the majority decision process, filtering process, non-linear process or the like for the detected information output, the additional information S partially becoming can be avoided.

As explained above, the accumulation of signal degradation of the signal B subsampled by repeating the subsampling process and the interpolation process can be controlled. Particularly, if the signal B is to be recorded with the additional information S on a recording medium, by setting the additional information S so as to suit the purpose, a subsampling apparatus and interpolation apparatus can be provided which are capable of responding to the two application modes, the mode of it being permissible to perfectly copy and the mode of prohibiting perfect copying of the signal B, which are opposite to each other. That is, when the perfect copying is permitted, the signal B has no information loss and signal degradation even when the copying is repeated many times. As a result, the signal B with a high quality can be readily provided to many people. On the other hand, when perfect copying is prohibited, the signal B has information loss and signal degradation in each repetition of copying process. As a result, the perfect copying of the signal B, which is illegal, can be prevented, resulting in the protection of the copyright.

In this embodiment, the interpolated signal detection circuit 202 is an additional information detection circuit for separating the additional information S from the interpolated signal C having the additional information S multiplexed therein.

In addition, in this embodiment, the generation of signal degradation by the signal degradation generation circuit 218 may be by any other method, so that various kinds of signal degradation methods can be considered including a method which does not pass a signal completely, a method which applies noise and a method in which the frequency characteristic is degraded.

Also, if case that the perfect copying of the signal B is to be prohibited, if the signal degradation is generated only during the first time of copying, the detection of the interpolated signal $C_2'$ is not required. As a result, in the interpolation circuit 225, the filter 229 may be different in characteristic from the filter 228, which means that a filter generally used in the prior art may be employed in which the sample data at the predetermined positions Y may be varied by the interpolation process. In this case, it is not necessary to detect the interpolated signal $C_2$ in the subsampling apparatus, and the interpolated signal detection circuit 202 does not need the filter 213 and comparator 215, so that the additional information generation circuit 207 may directly output the mode direction information M as the additional information B and the subsampling circuit 204 may be similar in arrangement to the subsampling circuit 104 shown in FIG. 1. With such a system structure, signal degradation due to the filter for band limitation is added to the signal B during the first time of copying. In the copying during from the second time, the mode direction information M can be made one, and no accumulation of signal degradation resulting from the copying follows.

In these embodiments, the signal A and signal B each is a signal having a one-dimensioned sample arrangement, however, it is not limited thereto, it may be a signal having an n-dimensional sample arrangement including two-dimensional sample arrangement as in the case of using a digital video signal and the like. In the case of a video signal, various kinds of subsampling process is for removing the pixels by changing the pixel positions to be removed by line, field or frame and the line sequential process for removing the color difference signal by one line will be within the scope of this invention. In addition, the ratio of the number of samples between the signal A and the signal B is 2:1; however, even if it is n:1, where n is an arbitrary integer, these embodiments are clearly realizable.

Further in addition, in the subsampling apparatus of these embodiments, the filter to be used for the interpolation process and the filter to be used for the subsampling process can be used in common on a circuit basis, and the filter to be used for the interpolation process in the interpolated signal detection circuit in the subsampling apparatus and the filter in the interpolation apparatus can be used perfectly in common.

Also, the subsampling apparatus and the interpolation apparatus of invention each can be easily used in combination with any encoder and decoder of high efficiency coding.

The signals A, B and C and the predetermined positions X and Y defined in these embodiments are defined as a first, second and third signal, and a first and second group positions, respectively, in the claims.

What is claimed is:

1. A subsampling method for reducing the number of samples of a first signal which is a sampled and quantized signal transmittable at a first sampling frequency to obtain a second signal which is transmittable at a second sampling frequency lower than said first sampling frequency, wherein sampling points of said first signal are composed of a first group of sampling points and a second group of sampling points and said second signal has only samples at the first group of sampling points, and wherein said first signal is one of an interpolated signal having samples at the second group of sampling points interpolated by a predetermined interpolation and a non-interpolated signal, said method comprising:

an interpolated signal detection step for detecting whether said first signal is said interpolated signal or said non-interpolated signal and generating a detection information signal indicative of a detection result; and a subsampling step responsive to said detection information signal for removing samples at the second group of sampling points directly from said first signal to obtain said second signal when said detection information signal indicates that said first signal is said interpolated signal and for subjecting said first signal to a predetermined pre-processing including a filtering processing and removing samples at the second group of sampling points from the pre-processed signal to obtain said second signal when said detection information signal indicates that said first signal is said non-interpolated signal.

2. A subsampling method according to claim 1, wherein said interpolated signal detection step comprises the steps of:

interpolating a sample at a specific sampling point in the second group of sampling points using predetermined samples at the first group of sampling points of said first signal by said predetermined interpolation to obtain an interpolated sample;

comparing said interpolated sample with a sample of said first signal at said specific sampling point; and outputting a signal indicating a comparison result as said detection information signal.

3. A subsampling method according to claim 1, wherein said interpolated signal detection step comprises the steps of:

removing from said first signal unnecessary frequency components which cannot be transmitted at said second sampling frequency;

comparing said unnecessary frequency components with a predetermined value; and outputting a signal indicating a comparison result as said detection information signal.

4. A subsampling method for reducing the number of samples of a first signal which is a sampled and quantized signal transmittable at a first sampling frequency to obtain a second signal which is transmittable at a second sampling frequency lower than said first sampling frequency, wherein sampling points of said first signal are composed of a first group of sampling points and a second group of sampling points and said second signal has only samples at the first group of sampling points, and wherein said first signal is either one of a first interpolated signal having samples at the second group of sampling points interpolated by a first predetermined interpolation, a second interpolated signal having samples at the second group of samples interpolated by a second predetermined interpolation different from said first predetermined interpolation and a non-interpolated signal, said method comprising:

an interpolated signal detection step for detecting whether said first signal is said interpolated signal, said second interpolated signal or said non-interpolated signal and generating a detection information signal indicative of a detection result; and a subsampling step responsive to said detection information signal for (a) removing samples at the second group of sampling points directly from said first signal to obtain said second signal when said detection information signal indicates that said first signal is said first interpolated signal, (b) degrading said first signal and removing samples at the second group of sampling points from the degraded signal to obtain said second signal when said detection information signal indicates that said first signal is said second interpolated signal, and (c) subjecting said first signal to a predetermined pre-processing including a filtering processing and removing samples at the second group of sampling points from the pre-processed signal to obtain said second signal when said detection information signal indicates that said first signal is said non-interpolated signal.

5. A subsampling method according to claim 4, wherein said interpolated signal detection step has an additional information signal generation step, which is responsive to both said detection information signal and an externally given mode direction information signal indicating either a mode of permitting copying of said second signal or a mode of prohibiting copying of said second signal, for generating an additional information signal indicating whether copying of said second signal is to be permitted or prohibited, and a step of outputting said additional information signal together with said second signal.

6. A subsampling method according to claim 5, wherein said additional information signal generating step generates, as said additional information signal, (a) a signal corresponding to said mode direction information signal when said detection information signal indicates that said first signal is said first interpolated signal, (b) a signal indicating a mode of prohibiting copying of said second signal independently of said mode direction information signal when said detection information signal indicates that said first signal is said second interpolated signal, and (c) a signal corresponding to said mode direction information signal when said detection information signal indicates that said first signal is said non-interpolated signal.

7. An interpolation method for increasing the number of samples of a first signal which is a sampled and quantized signal transmittable at a first sampling frequency to obtain a second signal which is transmittable at a second sampling frequency higher than said first sampling frequency, wherein sampling points of said second signal are composed of a first group of sampling points and a second group of sampling points and said first signal has only samples at the first group of sampling points, said method comprising the steps of:

subjecting said first signal to a plurality of different kinds of interpolation processing to obtain a plurality of interpolated signals each having samples of both said first and second groups of sampling points such that at least one of said plurality of interpolated signals has at the first group of sampling points the same samples of those at the first group of sampling points of said first signal;

receiving an additional information signal having additional information indicating whether copying of said first signal is to be permitted or prohibited; and selecting one of said plurality of interpolated signals according to said additional information signal to obtain said second signal so that samples at the second group of sampling points of said second signal contain information corresponding to the additional information of said additional information signal.

8. A method of detecting additional information contained in an input signal which is a sampled and quantized signal having samples at a first group of sampling points and samples at a second group of sampling points, wherein the samples at the second group of sampling points have been interpolated by a predetermined interpolation and contain said additional information indicating whether copying of said input signal is to be permitted or prohibited, said method comprising the steps of:

interpolating a sample at a specific sampling point in the second group of sampling points using predetermined samples at the first group of sampling points of said input signal to obtain an interpolated sample; and comparing said interpolated sample with a sample of said input signal at said specific sampling point to thereby obtain said additional information.

* * * * *